United States Patent
Okamoto

(10) Patent No.: US 6,601,003 B2
(45) Date of Patent: Jul. 29, 2003

(54) OPERATING EFFICIENCY OF A NONVOLATILE MEMORY

(75) Inventor: Toshiharu Okamoto, Tokyo (JP)

(73) Assignee: NEC Electronics Corporation, Kanagawa (JP)

(*) Notice: Subject to any disclaimer, the term of this patent is extended or adjusted under 35 U.S.C. 154(b) by 222 days.

(21) Appl. No.: 09/803,094

(22) Filed: Mar. 12, 2001

(65) Prior Publication Data

US 2002/0016690 A1 Feb. 7, 2002

(30) Foreign Application Priority Data

Mar. 14, 2000 (JP) .......................... 2000-071253

(51) Int. Cl.$^7$ ................................ G11C 7/00
(52) U.S. Cl. ............... 702/64; 702/60; 365/185.18; 365/185.23
(58) Field of Search .................... 702/64, 57, 60, 702/65, 79, 80, 124, 125, 126, 189, FOR 103–FOR 106, FOR 134, FOR 170, FOR 171; 327/198, 143; 365/185.23, 185.18, 185.11, 185.21, 189.09, 226; 713/300

(56) References Cited

U.S. PATENT DOCUMENTS 5,822,246 A * 10/1998 Taub et al. ............ 365/185.18
5,903,498 A * 5/1999 Campardo et al. ..... 365/185.23
6,128,231 A * 10/2000 Chung ................... 365/185.23

FOREIGN PATENT DOCUMENTS

| JP | 64-8599 | 1/1989 |
| JP | 02220297 | 9/1990 |
| JP | 11-150230 | 6/1999 |

* cited by examiner

Primary Examiner—Hal Wachsman
(74) Attorney, Agent, or Firm—Young & Thompson

(57) ABSTRACT

A voltage-divided voltage from a power supply voltage-dividing circuit is compared at a comparison circuit with a reference voltage from a reference voltage generation circuit. A low power-supply voltage signal is output, this signal being ON if the voltage-divided voltage is lower than the reference voltage, and OFF if the voltage-divided voltage is greater than the reference voltage. A low power-supply voltage control circuit receives the low power-supply voltage signal and, when the low power-supply voltage signal switches from OFF to ON, either suspends or executes an operation of switching a memory control signal that is output to the nonvolatile memory from active to inactive. This switching operation is halted at times such as when a power-supply voltage drop of extremely short time interval is expected.

9 Claims, 9 Drawing Sheets

OPERATING EFFICIENCY OF A NONVOLATILE MEMORY

BACKGROUND OF THE INVENTION

1. Field of the Invention

The present invention relates to a low power-supply voltage detection circuit, and more particularly to a low power-supply voltage detection circuit for detecting low power-supply voltage when a drop occurs in the power-supply voltage that is supplied to a nonvolatile memory.

2. Description of the Related Art

In the prior art, an internal high voltage is generated from the power-supply voltage by means of a booster circuit in order to write data or erase a page in nonvolatile memory.

The current-voltage characteristic of the internal high voltage generated from the booster circuit is dependent on the power-supply voltage, the internal high voltage typically increasing and the current supply capability improving with increase in the power-supply voltage. Conversely, decrease in the power-supply voltage results in lower internal high voltage and poor current supply capability.

When writing data and erasing pages at a power-supply voltage that is lower than operation specifications, the internal high voltage often fails to attain an adequate current-voltage characteristic, whereby incorrect data are written or data are corrupted. At a low power-supply voltage that does not ensure data writing or page erasing, control is effected such that data writing or page erasing in a nonvolatile memory is suspended.

FIG. 1 is a circuit diagram of a low power-supply voltage detection circuit disclosed in Japanese Patent Laid-open No. 8599/1989 that detects low power-supply voltage in order to exercise this type of control. This low power-supply voltage detection circuit comprises: resistor 901 and zener diode 902 connected together in series between power-supply voltage Vcc and ground; resistors 903 and 904 that are connected together in series between ground and the connection point of resistor 901 and zener diode 902; resistors 905 and 906 that are connected together in series between power-supply voltage Vcc and ground; comparator 907; and booster circuit 908.

The fixed voltage that is taken from the connection point of resistor 901 and zener diode 902 is voltage-divided at resistors 903 and 904 and supplied as a reference voltage to one of the input terminals of comparator 907. On the other hand, voltage obtained by voltage-dividing the power-supply voltage from the connection point of resistors 905 and 906 is led out and supplied to the other input terminal of comparator 907. Comparator 907 compares this voltage-divided voltage with the reference voltage, outputs high level to booster circuit 908 when the voltage-divided voltage is higher than the reference voltage, and outputs low level to booster circuit 908 when the voltage-divided voltage is equal to or lower than the reference voltage.

Power is thus not supplied to booster circuit 908 if the power-supply voltage is equal to or lower than a prescribed value, and operations such as data writing to the nonvolatile memory are halted.

However, even in cases in which the nonvolatile memory is operating at an adequate power-supply voltage, there are cases in which power-supply voltage undershoot occurs in which the power-supply voltage drops for an extremely short interval. In this case, the low power-supply voltage detection circuit detects the low power-supply voltage regardless of whether the operation of the nonvolatile memory is affected or not, and operations such as data writing are subjected to unpredictable halts. As shown in FIG. 2, with each occurrence of undershoot of the power-supply voltage, the output of comparator 907 switches to low level and operations such as data writing to a nonvolatile memory are halted. This phenomenon tends to occur when the operating power-supply voltage of the nonvolatile memory is low, or in a state in which a read operation is carried out in parallel with a write operation or an erase operation, such as when performing parallel operations such as a dual read. The same also holds true for a case of operating a charging-pump booster circuit at a low power-supply voltage and supplying a high current such as in CHE (Channel Hot Electron) mode flash memory.

SUMMARY OF THE INVENTION

It is an object of the present invention to provide a low power-supply voltage detection circuit that is capable of detecting low power-supply voltage without suspending such operations as data writing during instances of power-supply voltage undershoot of extremely short duration.

The low power-supply voltage detection circuit of the present invention detects drops in the power-supply voltage that is supplied to a nonvolatile memory that is capable of performing data writing and/or page erasing when a memory control signal is active, and comprises: a reference voltage generation means; a power supply voltage dividing means; a comparison means; and a low power-supply voltage control means.

The reference voltage generation means generates and outputs a fixed voltage as a reference voltage. The power supply voltage dividing means divides a voltage between the power-supply voltage and ground voltage and outputs this voltage as a voltage-divided voltage. The comparison means compares the reference voltage and voltage-divided voltage, turns the low power-supply voltage signal OFF when the voltage-divided voltage is higher than the reference voltage, and turns the low power-supply voltage signal ON and outputs the signal when the voltage-divided voltage is lower than the reference voltage. The low power-supply voltage control means effects control such that a memory control signal switching operation is either halted or enabled for a prescribed time interval; the memory control signal switching operation being an operation in which a memory control signal is activated and output when this low power-supply voltage signal is OFF and switched from active to inactive when the low power-supply voltage signal changes from the OFF state to the ON state.

The nonvolatile memory should be capable of performing at least one of data writing and page erasing, and be capable of switching between activity and inactivity of these operations by means of an input signal. A general-purpose flash memory can therefore be employed.

The reference voltage generation means can be constituted by generally used circuits such as a combination of zener diodes and resistors. A variety of circuits, such as an amplification circuit for amplification and output, can be used according to the specifications of the nonvolatile memory.

The power supply voltage-dividing means may be constituted by a generally known circuit. For example, a plurality of resistors may be connected together in series between the power supply line and ground and voltage then extracted from connection points between the resistors.

When voltage-dividing the power-supply voltage, the value of the voltage-divided voltage may be adjusted such that the ratio of the reference voltage to the voltage for performing the memory control signal switching operation is the same as the ratio of the voltage-divided voltage to the power-supply voltage. Of course, the value of the reference voltage may also be varied and adjusted.

The comparison means should have the functions of receiving and comparing the above-described reference voltage and voltage-divided voltage and switching the level of the output signal according to the size of the voltage-divided voltage with respect to the reference voltage, and a general-purpose comparator may therefore be used. The output signal is applied to the low power-supply voltage control means as the low power-supply voltage signal. Here, a circuit for dealing with hazards for preventing erroneous operation halts may be added to the low power-supply voltage signal output.

Since the ratio of the reference voltage to the voltage for performing the memory control signal switching operation is the same as the ratio of the voltage-divided voltage to the power-supply voltage, the level of the low power-supply voltage signal is switched according to the size of the actual power-supply voltage to the voltage for performing the memory control signal switching operation.

The low power-supply voltage control means activates the memory control signal when this low power-supply voltage signal is ON and outputs the signal to the nonvolatile memory. The memory control signal switching operation, in which the memory control signal is switched from active to inactive when the low power-supply voltage signal changes from OFF to ON, is then halted or performed for a prescribed time interval.

The voltage-divided voltage becomes higher than the reference voltage when the power-supply voltage is higher than the voltage for performing the memory control signal switching operation. Upon receipt of a voltage-divided voltage and reference voltage to the comparison means, the comparison means places the low power-supply voltage signal in the OFF state. The low power-supply voltage control means then receives the low power-supply voltage signal, which is OFF. When the low power-supply voltage signal is OFF, the low power-supply voltage control means activates the memory control signal. This memory control signal is applied to the nonvolatile memory, whereby the nonvolatile memory can perform data writing and page erasing.

The voltage-divided voltage becomes lower than the reference voltage when the power-supply voltage is lower than the voltage for performing the memory control signal switching operation. The comparison means then turns ON the low power-supply voltage signal, whereby the low power-supply voltage control means receives a low power-supply voltage signal that is ON. At this time, the low power-supply voltage control means either halts or allows execution for a prescribed time period of the memory control signal switching operation in which the memory control signal is switched from active to inactive. In this way, the memory control signal is switched between active and inactive when the low power-supply voltage signal is ON, whereby data writing and page erasing of the nonvolatile memory is halted or executed as necessary.

Voltage drops of extremely short duration tend to occur upon the start of operation of internal circuits that act as a source of power supply noise such as an internal high-voltage booster circuit, an output buffer, or a sense amplifier. Such power-supply voltage undershoots of extremely short duration do not substantially affect the operation of the nonvolatile memory. Thus, in the first embodiment of the present invention, the low power-supply voltage control means halts the memory control signal switching operation for a prescribed time interval from the start of operation of an internal circuit of a semiconductor device.

In other words, the operating efficiency of the nonvolatile memory can be raised because low power-supply voltage that is caused by noise originating in internal circuits of the semiconductor device is not detected, i.e., operations such as data writing are not halted in time intervals in which power-supply voltage undershoots are predicted. Voltage drops of extremely short duration also tend to occur upon the start of an internal operation sequence in data writing or page erasing of a nonvolatile memory. According to another embodiment of the present invention, when the nonvolatile memory is in the midst of data writing or page erasing, the low power-supply voltage control means suspends the memory control signal switching operation for a prescribed time interval from the time of starting these internal operation sequences.

In other words, low power-supply voltage caused by power-supply voltage undershoots of extremely short duration at the time of starting an internal operation sequence which have no substantial effect upon the operation of the nonvolatile memory are not detected, and operations such as data writing are not halted, thereby enabling an improvement in the operating efficiency of the nonvolatile memory.

The interval of a power-supply voltage undershoot of extremely short duration is shorter than the data reading cycle of the nonvolatile memory. In another embodiment of the present invention, the time interval from halting the memory control signal switching operation until the return to an executable state is less than the read cycle of a read operation that is performed as a parallel operation with data writing or page erasing of the nonvolatile memory.

In other words, the time interval in which operations such as data writing are not halted at the time of low power-supply voltage is made shorter than the data read cycle of the nonvolatile memory. As a result, low power-supply voltage can be detected while easily distinguishing between a power-supply voltage undershoot of extremely short duration and a drop in the power-supply voltage that would essentially necessitate halting operations such as data writing.

In this case, halting of operations such as data writing may be limited to sequences that require halting of operations such as data writing in an internal operation sequence in which the nonvolatile memory is in the midst of data writing or page erasing. In another embodiment of the present invention, a low power-supply voltage control means executes the memory control signal switching operation only during the period of a prescribed internal operation sequence when the nonvolatile memory is in the process of data writing or page erasing.

In other words, low power-supply voltage detection is carried out such that operations such as data writing are not halted despite the occurrence of a power-supply voltage undershoot of extremely short duration in a sequence that does not require halting of an operation such as data writing, thereby enabling an increase in operating efficiency of the nonvolatile memory.

The intervals that require a halt of data writing are the writing verify sequence interval and writing sequence interval. In another embodiment of the present invention, when the nonvolatile memory is in the midst of data writing, a low power-supply voltage control means executes memory control signal switching operation only for a writing verify sequence interval and writing sequence interval.

In other words, a signal indicating low power-supply voltage is not output for sequences other than a writing verify sequence interval and writing sequence interval during data writing despite the occurrence of a power-supply voltage undershoot of extremely short duration. In this way, an improvement can be obtained in the operating efficiency of the nonvolatile memory.

The intervals that require a halt of page erasing are the erase verify sequence interval and the erase sequence interval. In another embodiment of the present invention, when the nonvolatile memory is in the midst of page erasing, the low power-supply voltage control means executes the above-described memory control signal switching operation only in an erase verify sequence interval and erase sequence interval.

In other words, a signal indicating a low power-supply voltage is not output despite the occurrence of a power-supply voltage undershoot of extremely short duration for cases other than for an erase verify sequence interval and erase sequence interval during page erasing. In this way, an improvement can be obtained in the operating efficiency of the nonvolatile memory. In this case, the voltage at which operations such as data writing are halted may be switched according to the internal operating sequence of the nonvolatile memory. Thus, in another embodiment of the present invention, a power supply voltage dividing means includes a means for outputting a plurality of voltage-divided voltages and a means for switching these voltage-divided voltages according to the internal operating sequence when the nonvolatile memory is in the process of writing data or erasing pages.

In other words, since a low power-supply voltage is detected while switching between a plurality of voltage-divided voltages, the optimum voltage for halting operations such as data writing can be set according to the internal operating sequence of the nonvolatile memory. Halting of operations such as data writing is therefore not performed any more than necessary, and in this way, an improvement can be obtained in the operating efficiency of the nonvolatile memory.

Furthermore, approaches other than providing a plurality of voltage-divided voltages may be adopted for switching the voltage for halting operations such as data writing. In another embodiment of the present invention, the reference voltage generation means includes a means for outputting a plurality of reference voltages and a means for switching these reference voltages according to the internal operating sequence when the nonvolatile memory is in the process of data writing or page erasing. In other words, low power-supply voltage is detected while switching between a plurality of reference voltages, thereby enabling setting of the optimum voltage for halting operations such as data writing according to internal operating sequence. Halting of operations such as data writing is therefore not performed more than necessary, and the operating efficiency of the nonvolatile memory is correspondingly improved.

The above and other objects, features, and advantages of the present invention will become apparent from the following description based on the accompanying drawings which illustrate examples of preferred embodiments of the present invention.

DETAILED DESCRIPTION OF THE PREFERRED EMBODIMENTS

Figure 1:
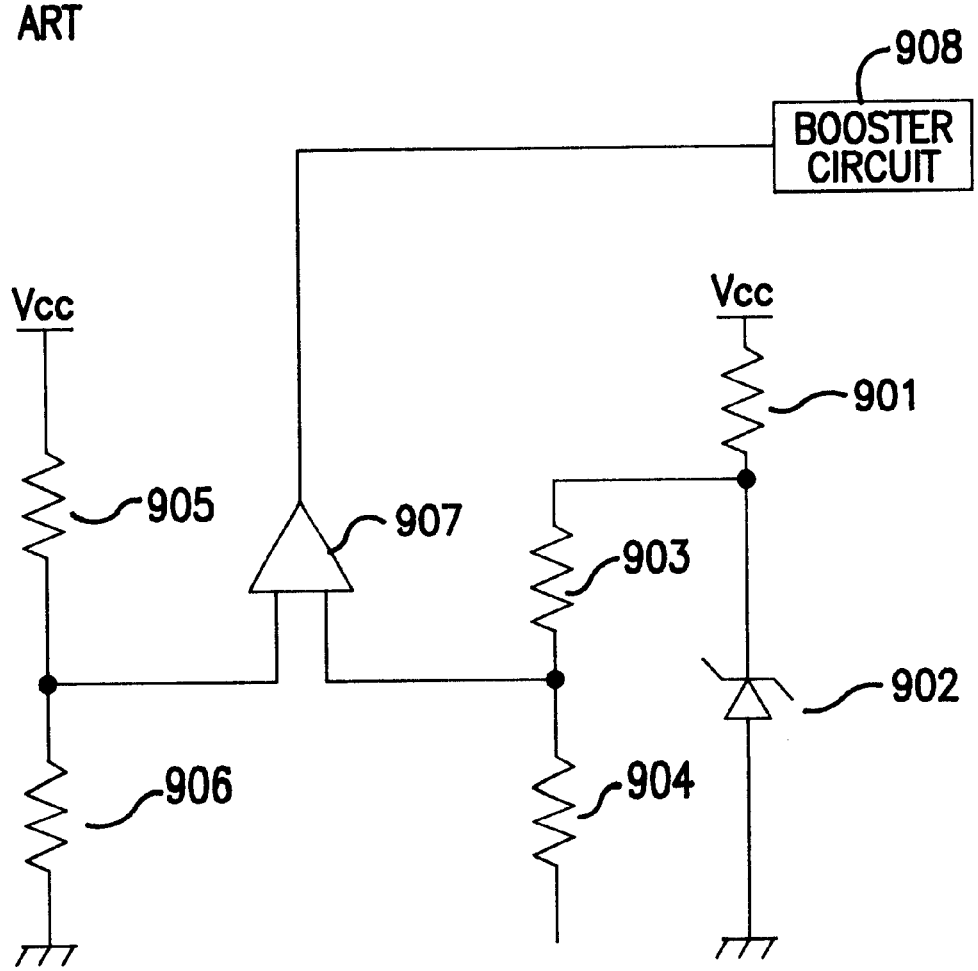
FIG. 1 is a circuit diagram of a low power-supply voltage detection circuit that is disclosed in Japanese Patent Laid-open No. 8599/1989.
Figure 2:
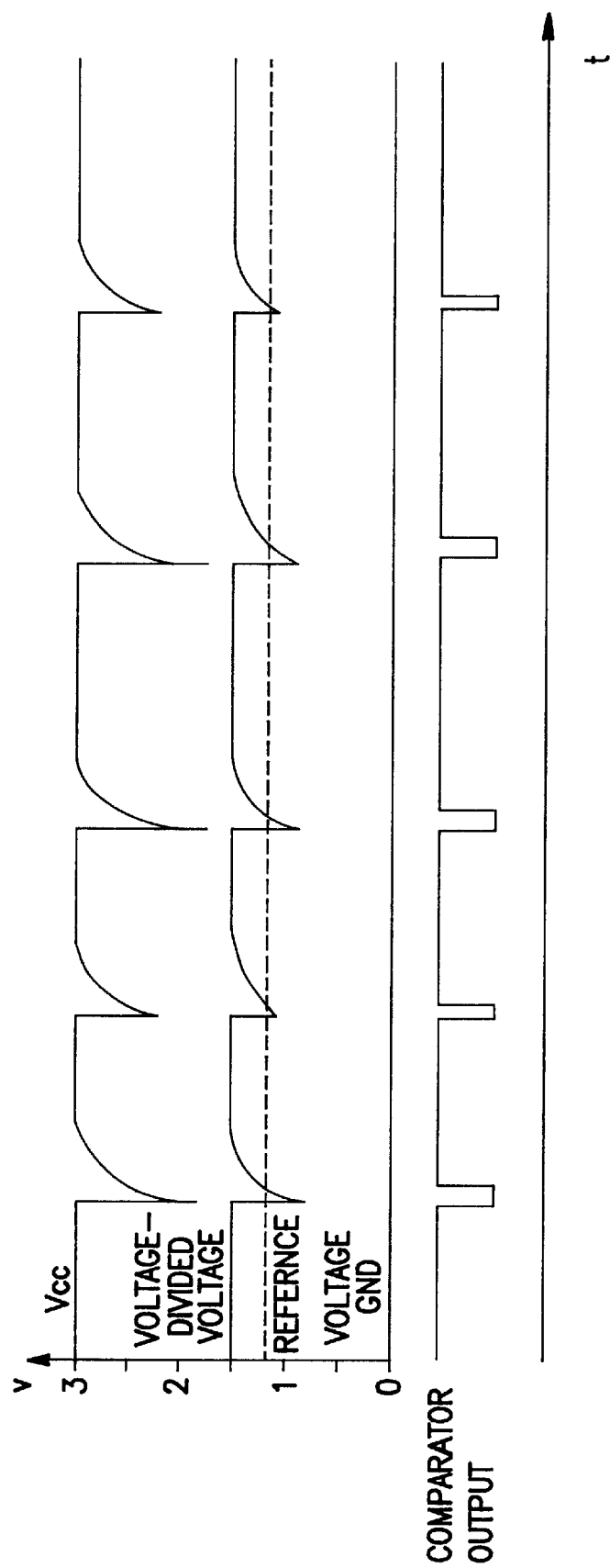
FIG. 2 is a timing chart showing the operation of the circuit shown in FIG. 1 at the time of occurrence of a power-supply voltage undershoot of extremely short duration.
Figure 3:
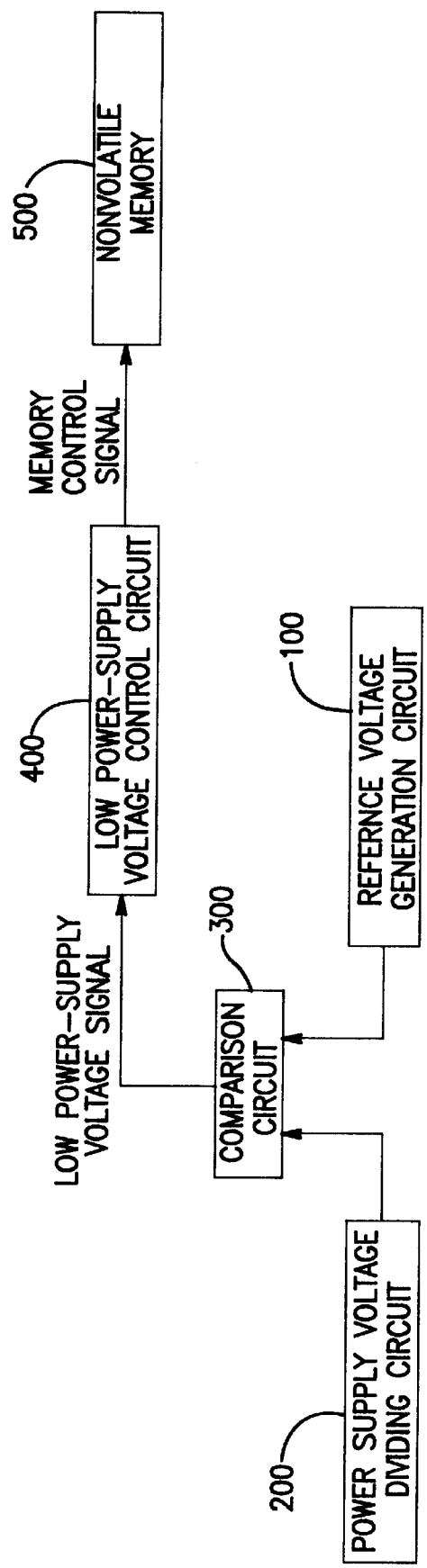
FIG. 3 is a block diagram of a low power-supply voltage detection circuit according to the first embodiment of the present invention.

Referring now to FIG. 3, there is shown a low power-supply voltage detection circuit according to the first embodiment of the present invention that comprises, reference voltage generation circuit 100, power supply voltage-dividing circuit 200, comparison circuit 300, and low power-supply voltage control circuit 400.

Reference voltage generation circuit 100 generates and outputs a fixed voltage as a reference voltage, and, for example, consists of a resistor and a zener diode connected in series between the power supply line and ground, the reference voltage being extracted from connection point between the resistor and the zener diode.

Power supply voltage-dividing circuit 200 divides and outputs a voltage between the power-supply voltage and the ground potential as a voltage-divided voltage; and consists of, for example, a plurality of resistors connected together in series between the power supply line and ground, the voltage-divided voltage being extracted from the connection point between the resistors.

Comparison circuit 300 compares the voltage-divided voltage from power supply voltage-dividing circuit 200 with the reference voltage from reference voltage generation circuit 200. When the voltage-divided voltage is greater than the reference voltage, comparison circuit 300 outputs a low power-supply voltage signal of high level, which is the OFF state. Conversely, when the voltage-divided voltage is lower than the reference voltage, comparison circuit 300 outputs a low level low power-supply voltage signal, which is the ON state.

Low power-supply voltage control circuit 400 receives the low power-supply voltage signal, and after prescribed processing, outputs a control signal to nonvolatile memory 500.

Nonvolatile memory 500 is designed to perform data writing or page erasing at a high internal voltage. When the memory control signal is active, data writing or page erasing can be carried out with respect to nonvolatile memory 500, but these operations are halted when the memory control signal is inactive.

Low Vcc lock voltage, which is the voltage at which operations such as data writing of nonvolatile memory 500 are halted when the power-supply voltage falls, is the reference for the timing of switching the state of low power-supply voltage signal.

The reference voltage of comparison circuit 300 is a value obtained by multiplying the low Vcc lock voltage with the ratio of the voltage-divided voltage to the power-supply voltage in order to monitor the voltage-divided voltage of the power-supply voltage and switch the state of the low power-supply voltage signal. The adjustment of the voltage-divided voltage and reference voltage is performed by varying the value of the resistors that are included within power supply voltage dividing circuit 200 and reference voltage generation circuit 100. In addition, the low Vcc lock voltage is preferably set based on the effective power-supply voltage in the semiconductor device.

Low power-supply voltage control circuit 400 receives the low power-supply voltage signal and controls whether or not operations such as data writing are to be halted when the power-supply voltage drops. Low power-supply voltage control circuit 400 receives signals from outside the semiconductor device such as data signals and chip enable signals as well as signals from inside the semiconductor device such as the low power-supply voltage signal. Based on these signals, low power-supply voltage control circuit 400 performs calculations for outputting signals that control the operation of the semiconductor device and outputs signals to circuits inside the semiconductor device and outside the semiconductor device.

Low power-supply voltage control circuit 400 activates the memory control signal when the low power-supply voltage signal is high level and outputs the control signal to nonvolatile memory 500. When the low power-supply voltage signal changes from high level to low level, low power-supply voltage control circuit 400 is capable of switching the memory control signal from active to inactive and halting or enabling the switching operation in a prescribed period after the above-described calculations.

When this switching is enabled, operations such as data writing of nonvolatile memory 500 can be halted. At such times, low power-supply voltage control circuit 400 makes the memory control signal inactive at the time of switching the low power-supply voltage signal to low level. As a result, a halt is placed on data writing to nonvolatile memory 500. In addition, data writing of nonvolatile memory 500 is not halted when switching of the memory control signals is suspended. At such times, data writing to nonvolatile memory 500 is not halted despite switching of the low power-supply voltage signal to low level.

Control for not effecting a low Vcc lock that halts data writing at voltages that are equal to or lower than the low Vcc lock voltage begins when a power-supply voltage undershoot of extremely short duration can be expected. In the present embodiment, these times are during operation of internal circuits that serve as a source of noise in a semiconductor device or at the time of starting an internal operating sequence during data writing or during page erasing of nonvolatile memory 500. In addition, the time periods in which a low Vcc lock is not effected are equal to or less than the data writing cycle of nonvolatile memory 500.

Figure 4:
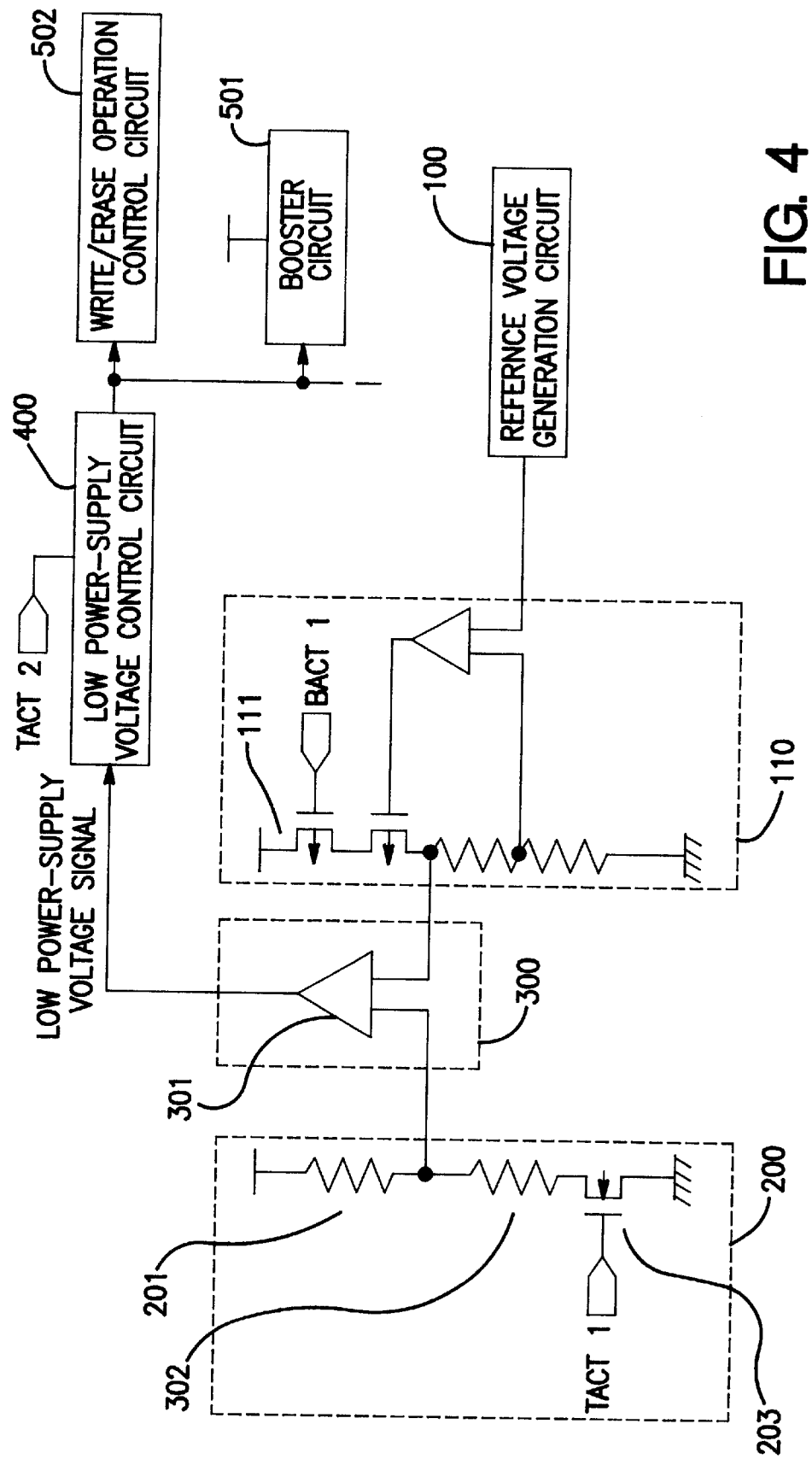
FIG. 4 is a circuit diagram of an actual example of the circuit of FIG. 3.

FIG. 4 is a circuit diagram of the principal components of an actual example of the circuit of FIG. 3. In this figure, booster circuit 501 and write/erase operation control circuit 502 are provided as peripheral circuits of nonvolatile memory 500. These circuits receive memory control signals from low power-supply voltage control circuit 400 and perform data writing and page erasing of nonvolatile memory 500.

The reference voltage output of reference voltage generation circuit 100 is supplied to reference voltage amplification circuit 110 for amplification. Reference voltage amplification circuit 110 receives the BACT1 signal supplied from low power-supply voltage control circuit 400 to activate or deactivate the operation of reference voltage amplification circuit 110.

The BACT1 signal is applied to p-channel MOS transistor 111 in reference voltage amplification circuit 110, and p-channel MOS transistor 111 is in a switched-OFF state while the BACT1 signal is at high level. In other words, reference voltage amplification circuit 110 is in an inactive state. When the BACT1 signal switches to low level, p-channel MOS transistor 111 enters the switched-ON state to activate reference voltage amplification circuit 111. The reference voltage from reference voltage generation circuit 100 is then amplified at reference voltage amplification circuit 110, and applied to comparison circuit 300.

Power supply voltage-dividing circuit 200 consists of resistors 201 and 202 connected in series between the power supply line and ground, and supplies voltage-divided voltage from the connection point of resistors 201 and 202 to comparison circuit 300. This voltage-divided voltage is determined by the resistance of resistors 201 and 202, and is the product of multiplying the power-supply voltage by a value obtained by dividing the resistance of resistor 202 by the sum of resistance of resistors 201 and 202.

Power supply voltage-dividing circuit 200 further includes n-channel MOS transistor 203 connected between resistor 202 and ground and is supplied with a TACT1 signal from low power-supply voltage control circuit 400. The TACT1 signal is of the opposite level, high level or low level, of the BACT1 signal. Thus, when the semiconductor device is in a standby state, the TACT1 signal is at low level, n-channel MOS transistor 203 that receives this input is in a switched-OFF state, and hence power supply voltage dividing circuit 200 is in an inactive state.

When the semiconductor device is operating, the TACT1 signal switches to high level, making n-channel MOS transistor 203 the switched-ON state to activate power supply voltage-dividing circuit 200.

Comparison circuit 300 consists of comparator 301, which receives the amplified reference voltage from reference voltage amplification circuit 110 and the voltage-divided voltage from power supply voltage dividing circuit 200. Comparator 301 switches the voltage level of the low power-supply voltage signal according to the size of the voltage-divided voltage with respect to the reference voltage. The low power-supply voltage signal is at high level when the voltage-divided voltage is greater than the reference voltage, and the low power-supply voltage signal is at low level when the voltage-divided voltage is lower than the reference voltage.

Low power-supply voltage control circuit 400 receives a TACT2 signal and based on the TACT2 signal, determines whether to execute or suspend the memory control signal switching operation. The TACT2 signal is supplied from another control circuit not shown in the figure.

Figure 5:
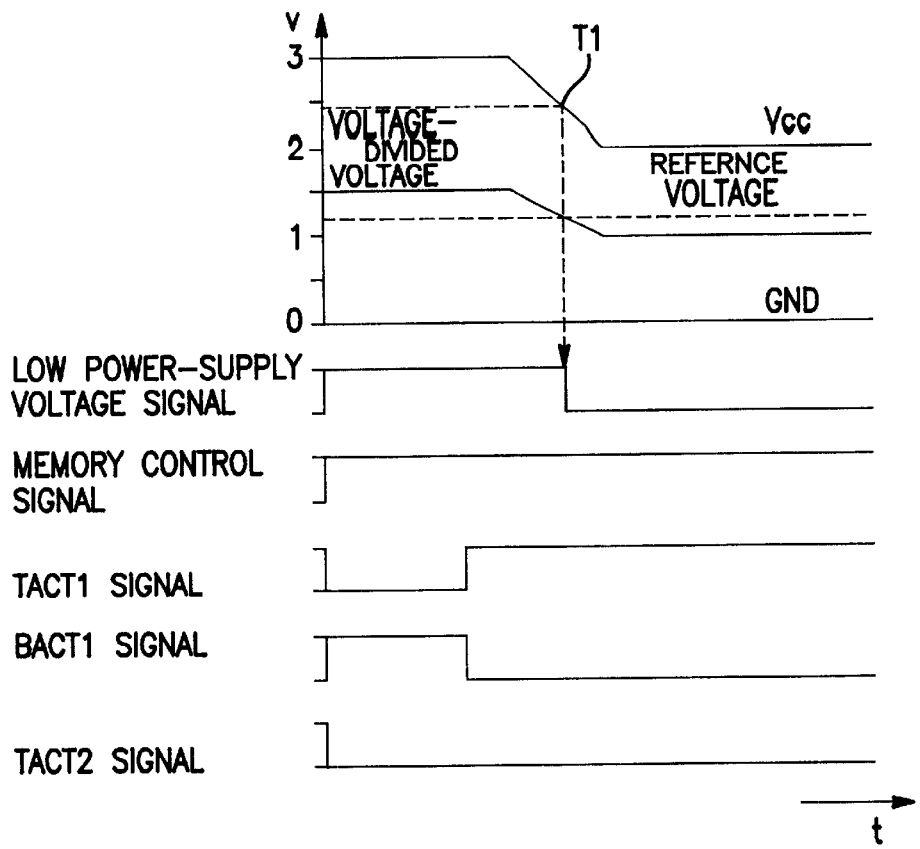
FIG. 5 is a timing chart showing the operation of the low power-supply voltage detection circuit of the embodiment of FIG. 4 when halting the low Vcc lock.
Figure 6:
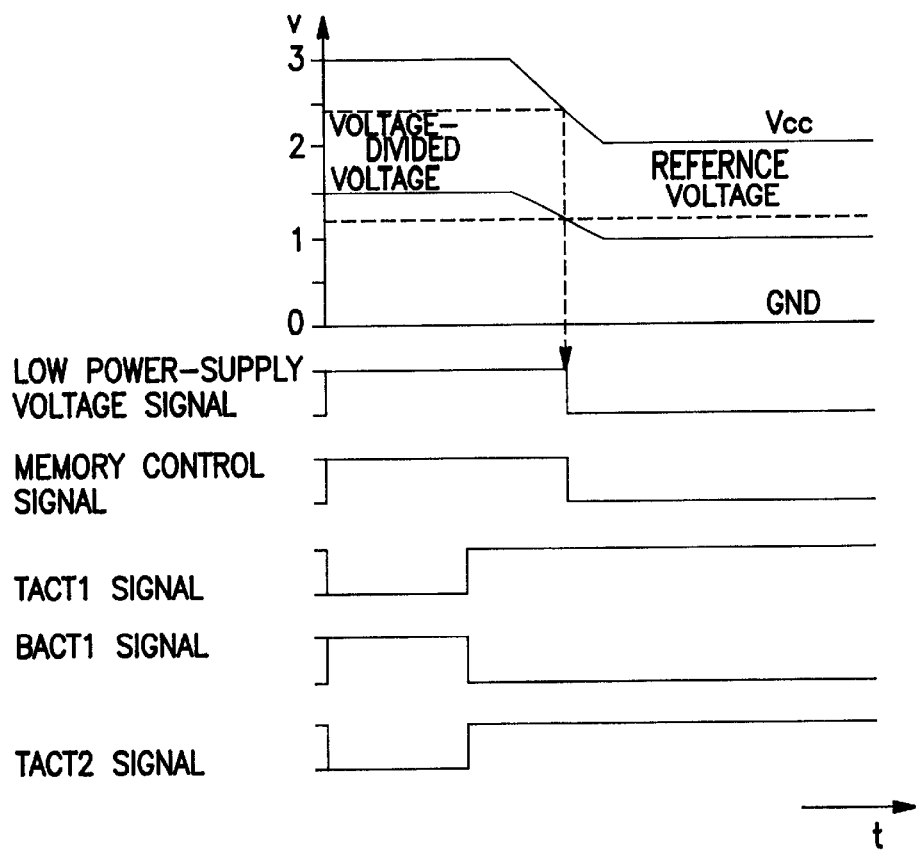
FIG. 6 is a timing chart showing the operation of the embodiment of FIG. 4 when the low Vcc lock is not halted.

An example of the operation of this low power-supply voltage detection circuit is next described. FIG. 5 is a timing chart showing the operation when the low Vcc lock is halted using the low power-supply voltage detection circuit of this embodiment. In addition, FIG. 6 is a timing chart showing the operation when the low Vcc lock is not halted using the low power-supply voltage detection circuit of the present embodiment.

When the power-supply voltage drops and falls to or below low Vcc lock voltage at timing T1, the voltage-divided voltage falls below the reference voltage, switching the low power-supply voltage signal from high level, which is the OFF state, to low level, which is the ON state. In this case, the memory control signal switching operation is not halted when the TACT2 signal applied to low power-supply voltage control circuit 400 is at high level. At this time, the memory control signal switches from high level to low level as shown in FIG. 6, placing the low Vcc lock on nonvolatile memory 500.

When the low power-supply voltage detection circuit halts the memory control signal switching operation, however, the memory control signal remains at high level even though the low power-supply voltage signal switches from high level to low level, as shown in FIG. 5. The low Vcc lock is therefore not placed on nonvolatile memory 500.

Figure 7:
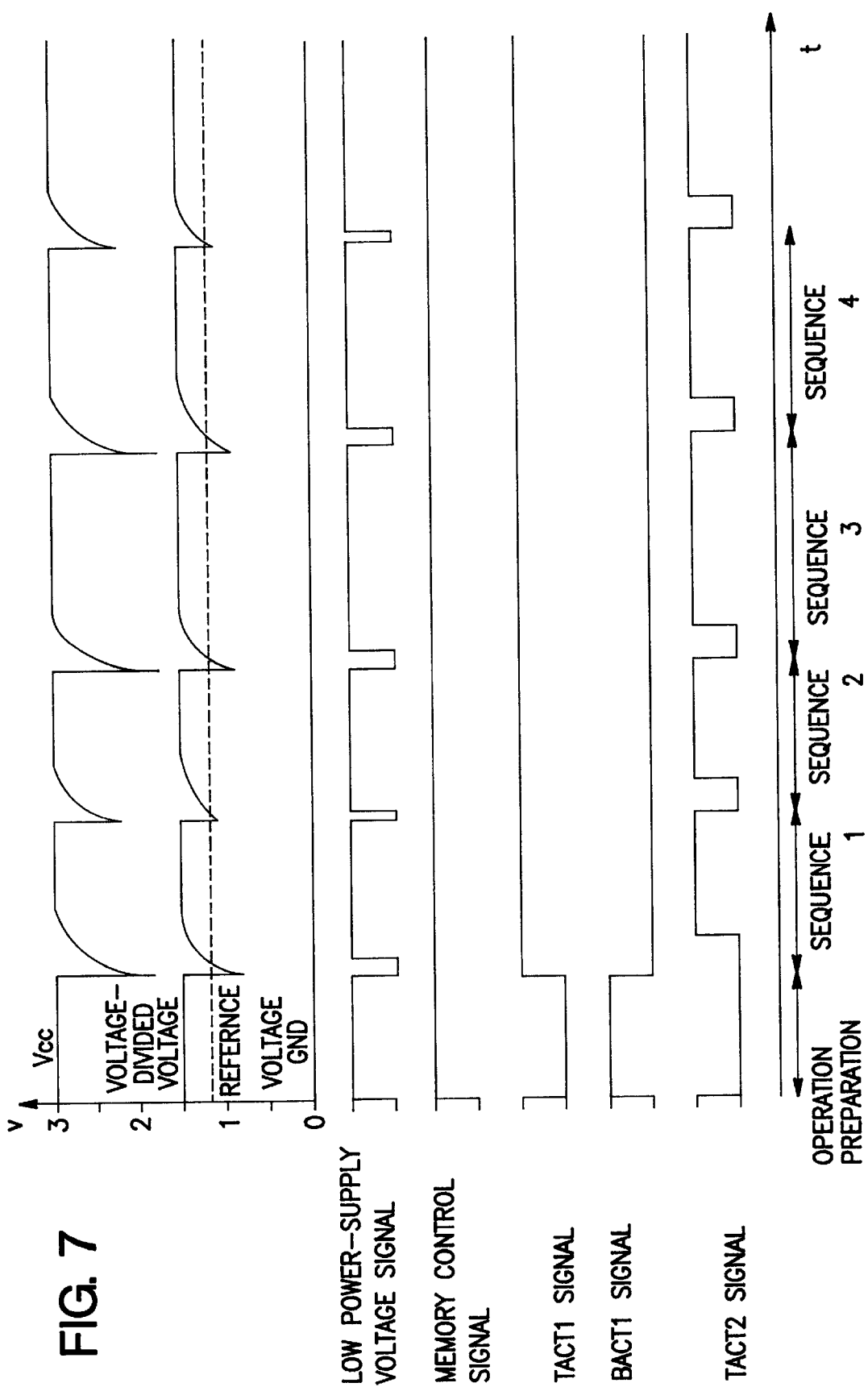
FIG. 7 is a timing chart showing the operation of the embodiment of FIG. 4 at the time of occurrence of a power-supply voltage undershoot of extremely short duration.

The operation of low power-supply voltage detection circuit 100 when a power-supply voltage undershoot of extremely short duration occurs is next explained with reference to FIG. 7 which shows a timing chart according to an internal operation sequence when nonvolatile memory 500 is carrying out data writing or page erasing.

After completion of operation preparations of the semiconductor device, the TACT2 signal applied to low power-supply voltage control circuit 400 is at low level for a prescribed time interval from the start of each internal operation sequence, and otherwise is at high level.

When the power-supply voltage drops to or below the low Vcc lock voltage at the start of each internal operation sequence, the voltage-divided voltage falls to or below the reference voltage, switching the low power-supply voltage signal from high level to low level at each of these times.

However, the memory control signal remains at high level because the TACT2 signal causes suspension of the memory control signal switching operation for a prescribed time interval from the start of each internal operation sequence. As a result, the low Vcc lock is not placed on nonvolatile memory 500 at power-supply voltage undershoots of extremely short duration.

Thus, in this embodiment, the memory control signal switching operation is suspended when power-supply voltage undershoots of extremely short duration, which do not affect the operation of nonvolatile memory 500, can be expected. Operations such as data writing are therefore not halted more than necessary, thereby improving the operating efficiency of nonvolatile memory 500.

This embodiment is further capable of limiting the modes among the internal operation sequences such as data writing that are performed by nonvolatile memory 500 in which it is desired that the memory control signal switching operation be enabled. In other words, the TACT2 signal is placed at high level for those modes, of the internal operation sequences such as data writing that are performed by nonvolatile memory 500, in which it is desired that the memory control signal switching operation be executable. During data writing, for example, the TACT2 signal is placed at high level in the writing verify sequence period and the writing sequence period, and the TACT2 signal is placed at low level in other sequence periods.

Low power-supply voltage control circuit 400 can then make the memory control signal high level or low level according to the low power-supply voltage signal only for the writing verify sequence period and writing sequence period. It is thus possible to limit the modes in which it is desired that the memory control signal switching operation be enabled.

Because the present embodiment is thus capable of limiting the modes in which execution of the memory control signal switching operation is desired, operations such as data writing are not halted more than necessary with regard to this aspect as well, thereby improving the operating efficiency of the nonvolatile memory.

Figure 8:
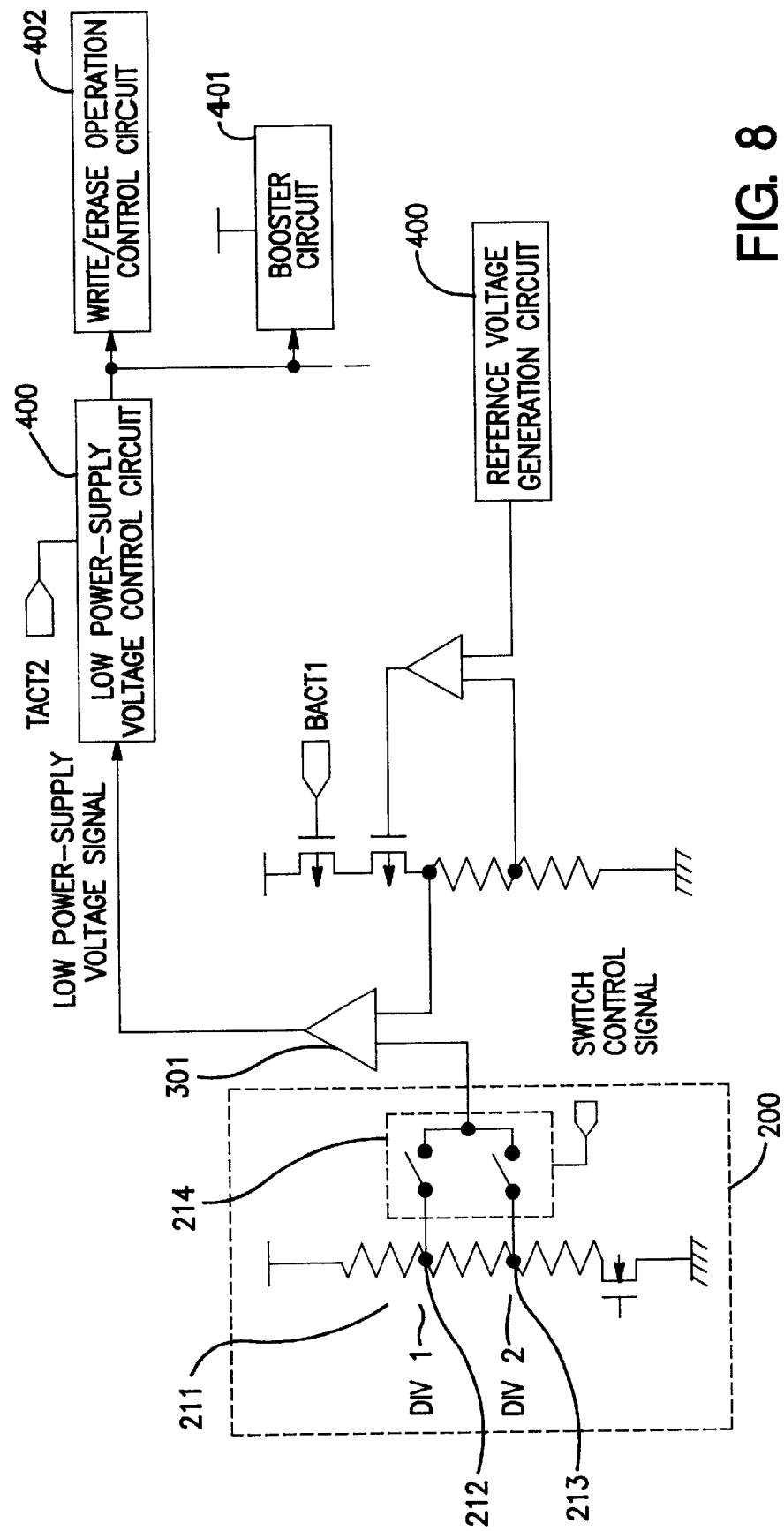
FIG. 8 is a circuit diagram of the low power-supply voltage detection circuit according to the second embodiment of the present invention.

FIG. 8 shows the low power-supply voltage detection circuit according to the second embodiment of the present invention. This embodiment enables switching of the level of the low Vcc lock voltage. In FIG. 8, power supply voltage-dividing circuit 200 is configured to extract the voltage-divided voltages from a plurality of voltage dividing points 212 and 213 in resistor 211. Switch 214 is connected to voltage dividing points 212 and 213, one of which is selected by a switch control signal supplied from low power-supply voltage control circuit 400 to output the voltage-divided voltage of that point.

Figure 9:
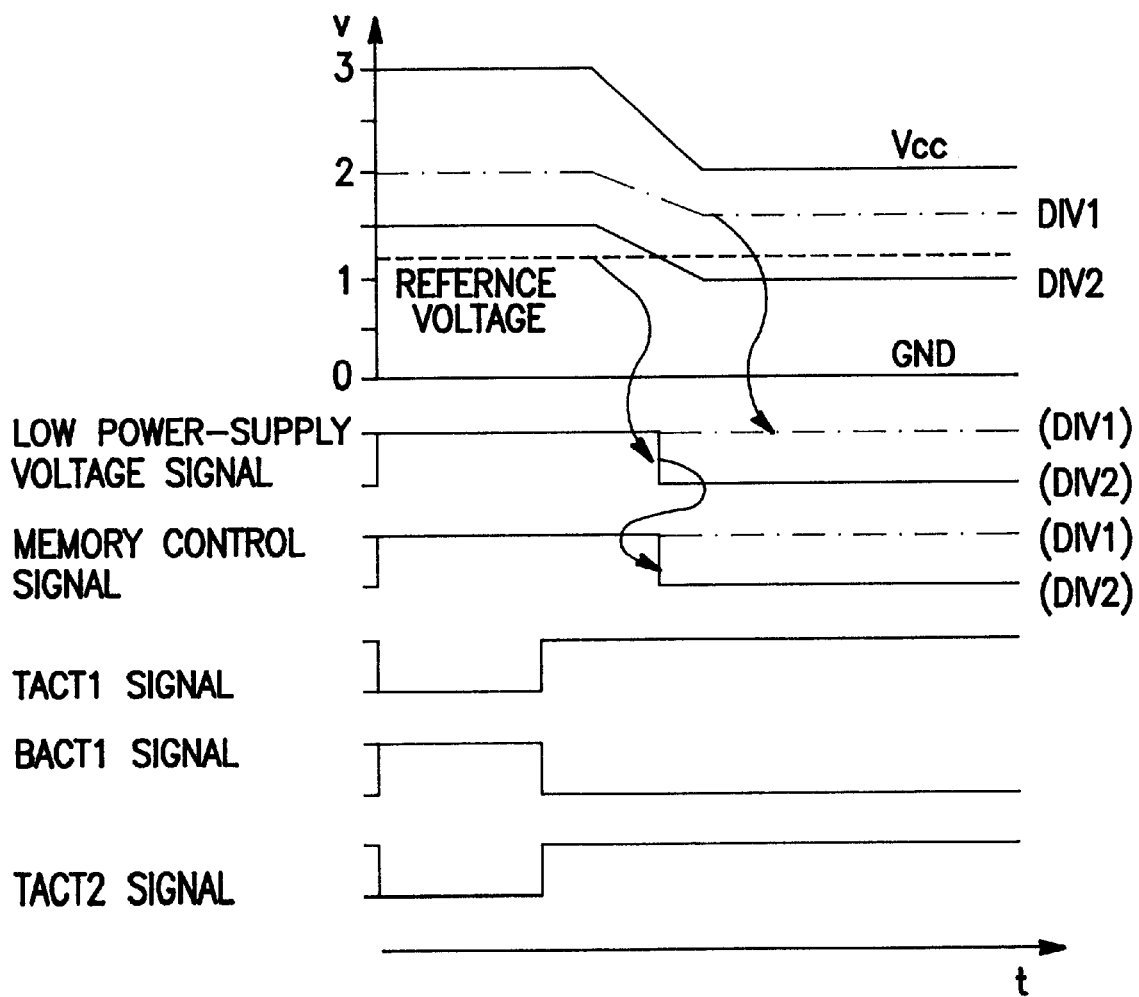
FIG. 9 is a timing chart showing the operation of the embodiment of FIG. 8 when switching the voltage level of the low Vcc lock.

FIG. 9 is a timing chart showing the operation when switching the low Vcc lock voltage levels of the second embodiment.

In FIG. 9, the TACT2 signal is at high level at the time of operation of semiconductor device, placing the memory control signal switching operation in an executable state. In this case, there are two levels of voltage-divided voltage DIV1 and DIV2 where DIV1 is greater than DIV2. When DIV2 is used to detect low Vcc lock voltage, then the memory control signal switches from high level to low level because DIV2 is lower than the reference voltage in FIG. 9.

When DIV1 is selected by switch 214, on the other hand, the memory control signal switching operation is not carried out because DIV1 is greater than the reference voltage. Performing control such that a low voltage-divided voltage is selected in cases in which the lower limit voltage value of a power-supply voltage undershoot is low and a high voltage-divided voltage is selected for the opposite case enables low Vcc locking of greater efficiency.

Figure 10:
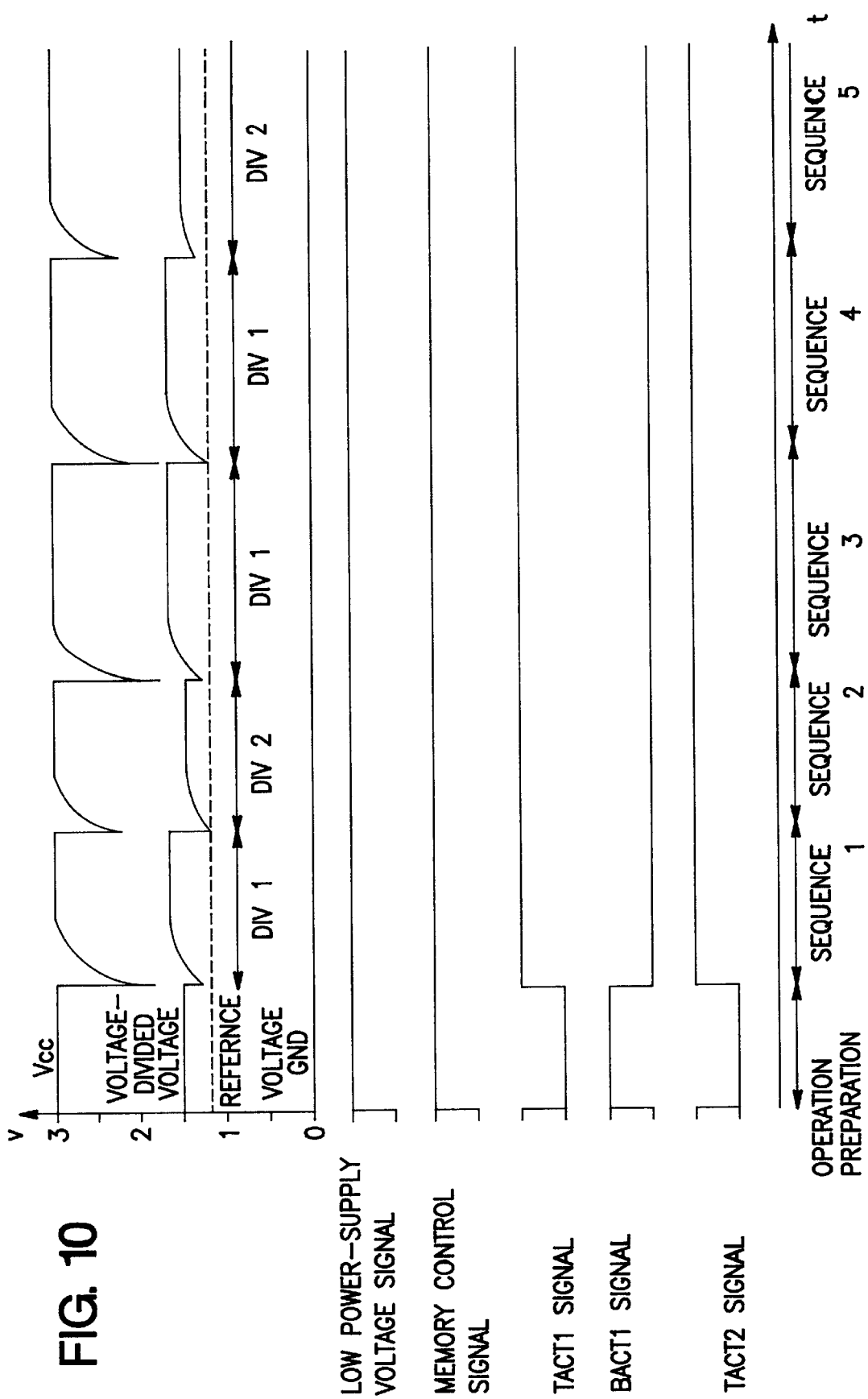
FIG. 10 is a timing chart showing the operation of the embodiment of FIG. 8 at the time of occurrence of a power-supply voltage undershoot of extremely short duration.

FIG. 10 is a timing chart for a case of switching the voltage-divided voltage upon the occurrence of a power-supply voltage undershoot of extremely short duration.

In FIG. 10, sequence 1, sequence 3, and sequence 4 are periods in which the minimum voltage value of a power-supply voltage undershoot is expected to be relatively low, and sequence 2 and sequence 5 are periods in which this minimum voltage value is expected to be relatively high. For this reason, DIV1, which is a relatively high voltage-divided voltage, is used to detect low power-supply voltage for sequence 1, sequence 3, and sequence 4, while DIV2, which is a relatively low voltage-divided voltage, is used to detect low power-supply voltage for sequence 2 and sequence 5.

As shown in FIG. 10, the low power-supply voltage signal is at high level even though a high voltage-divided voltage is selected in sequence 2 and sequence 5, in which the minimum voltage value of a power-supply voltage undershoot is relatively high. In contrast, a low voltage-divided voltage is selected in sequence 1, sequence 3, and sequence 4, in which the minimum voltage value of a power-supply voltage undershoot is relatively low, and the voltage-divided voltage is therefore equal to or greater than the reference voltage and the low power-supply voltage signal remains at high level. The memory control signal remains at high level in both cases, and a low Vcc lock is not placed on nonvolatile memory 500.

Although the present embodiment has been described with regard to a case in which a low power-supply voltage is detected while switching the level of the voltage-divided voltage, low power-supply voltage can be similarly detected by switching the level of the reference voltage.

Thus, in the second embodiment, the level of the low power-supply voltage that is detected can be switched according to the expected minimum voltage value of a power-supply voltage undershoot of extremely short duration. As a result, operations such as data writing are not halted more than is necessary, thereby improving in the operating efficiency of a nonvolatile memory.

While preferred embodiments of the present invention have been described using specific terms, such description is for illustrative purposes only, and it is to be understood that changes and variations may be made without departing from the spirit or scope of the following claims.

What is claimed is:

1. A low power-supply voltage detection circuit for detecting drops in power-supply voltage that is supplied to a nonvolatile memory that performs at least one of data writing and page erasing when a memory control signal is active, comprising:

a reference voltage generation means for generating and outputting a fixed voltage as a reference voltage;

a power supply voltage-dividing means for dividing the voltage between the power-supply voltage and a ground voltage and outputting the result as a voltage-divided voltage;

a comparison means for comparing said voltage-divided voltage with said reference voltage, said comparison means outputting a low power-supply voltage signal when said voltage-divided voltage is higher than said reference voltage corresponding to an OFF state, and outputting the low power-supply voltage signal when said voltage-divided voltage is lower than said reference voltage corresponding to an ON state; and a low power-supply voltage control means for effecting control to either execute or suspend for a prescribed time period a memory control signal switching operation in which said memory control signal is activated and output when the low power-supply voltage signal is in the OFF state and said memory control signal is switched from active to inactive when the low power-supply voltage signal changes from the OFF state to the ON state.

2. The circuit according to claim 1, wherein said low power-supply voltage control means includes a means for halting said memory control signal switching operation for a prescribed time interval from the start of each internal circuit operation sequence.

3. The circuit according to claim 1, wherein said low power-supply voltage control means includes a means for, when said nonvolatile memory is in the midst of data writing or page erasing, halting said memory control signal switching operation for a prescribed time interval from the start of the internal operation sequence of the data writing or page erasing.

4. The circuit according to claim 1, wherein the time interval for suspending to returning to execution of said memory control signal switching operation is equal to or less than the read cycle of a read operation that is carried our as a parallel operation with data writing or page erasing of said nonvolatile memory.

5. The circuit according to claim 1, wherein said low power-supply voltage control means includes means for executing said memory control signal switching operation only in intervals of prescribed internal operation sequences when said nonvolatile memory is in the midst of data writing or page erasing.

6. The circuit according to claim 5, wherein said low power-supply voltage control means includes means for executing said memory control signal switching operation only in a write verify sequence interval and a write sequence interval when said nonvolatile memory is in the midst of data writing.

7. The circuit according to claim 5, wherein said low power-supply voltage control means includes means for executing said memory control signal switching operation only in an erase verify sequence interval and an erase sequence interval when said nonvolatile memory is in the midst of page erasing.

8. The circuit according to claim 1, wherein said power supply voltage-dividing means includes means for outputting a plurality of voltage-divided voltages; and means for switching between the plurality of voltage-divided voltages when said nonvolatile memory is in the midst of data writing or page erasing.

9. The circuit according to claim 1, wherein said reference voltage generation means includes means for outputting a plurality of reference voltages; and means for switching between said plural reference voltages when said nonvolatile memory is in the midst of data writing or page erasing.

* * * * *